United States Patent [19]

Inagawa et al.

[11] Patent Number: 5,073,687
[45] Date of Patent: Dec. 17, 1991

[54] METHOD AND APPARATUS FOR WORKING PRINT BOARD BY LASER

[75] Inventors: Hideho Inagawa, Yokohama; Shigenobu Nojo, Kawasaki, both of Japan

[73] Assignee: Canon Kabushiki Kaisha, Tokyo, Japan

[21] Appl. No.: 541,374

[22] Filed: Jun. 21, 1990

[30] Foreign Application Priority Data

Jun. 22, 1989 [JP] Japan .................................. 1-160281
Oct. 27, 1989 [JP] Japan .................................. 1-278353

[51] Int. Cl.$^5$ ............................................. B23K 26/00
[52] U.S. Cl. ............................ 219/121.7; 219/121.71; 219/121.76
[58] Field of Search ........... 219/121.7, 121.71, 121.76; 364/474.08

[56] References Cited

U.S. PATENT DOCUMENTS 3,974,016  8/1976  Bondybey et al. ........ 219/121.64 X
4,839,497  6/1989  Sankar et al. .................. 219/121.71

FOREIGN PATENT DOCUMENTS

62-254117  11/1987  Japan .
62-289390  12/1987  Japan .
  13462   1/1989  Japan .

Primary Examiner—C. L. Albritton
Attorney, Agent, or Firm—Fitzpatrick, Cella, Harper & Scinto

[57] ABSTRACT

A laser output is converted into a pulse output and the pulse output is made variable in accordance with each portion of a copper foil portion and a resin portion of the surface of a print board and a copper foil portion of the back surface.

6 Claims, 8 Drawing Sheets

METHOD AND APPARATUS FOR WORKING PRINT BOARD BY LASER

BACKGROUND OF THE INVENTION

1. Field of the Invention

The present invention relates to a working method by a laser and, more particularly, to a technique in which a hole digging work of a copper foil pattern of a printed circuit board (hereinafter, referred to as a print board) is executed by a laser.

2. Related Background Art

The inventors of the present invention have already proposed a technique in which in order to work through holes into a print board, lasers of different kinds of wavelengths are irradiated onto a working surface of the print board and holes are worked in Japanese Patent Application No. 1-3462.

On the other hand, in JP-A-62-289390, there has been disclosed a laser working machine in which two laser beams of different wavelengths are used and the beams are irradiated to the same location to thereby work.

Further, in JP-A-62-254117, there has been disclosed an apparatus in which different kinds of laser beams which are oscillated from independent laser apparatuses are mixed and irradiated.

Hitherto, when a micro through-hole is formed, a hole forming work is executed by using a drill having a microdiameter of, for instance, about 0.2 to 0.3 mm.

In the case of the hole forming work using such a drill, when the number of holes to be formed is small, a high working accuracy of a certain degree is obtained. However, when the hole forming work is continuously executed, the cutting performance deteriorates and the drill is damaged due to heat generation during the working operation of the drill, so that the working time becomes long and the surface roughness of the cross section of the hole also deteriorates. On the other hand, in the case of the drill working, the drill having a diameter of about 0.1 mm is easily bent or damaged and it is also difficult to automatically execute the hole forming work.

Further, in the case of the above drill working, the surface roughness of the worked cross section becomes very rough and even if the front and back surfaces are plated in order to make the copper foil patterns on the front and back surfaces conductive after the holes were formed, an enough plating coated film cannot be obtained on the cross sectional surface.

SUMMARY OF THE INVENTION

It is an object of the invention to obtain a predetermined surface roughness accuracy for a cross sectional surface of a microhole in the case where a microhole having a diameter of, e.g., 100 μm or less is formed in a working object such as a print board or the like.

Particularly, the invention intends to provide a method of working a hole in which in order to obtain an electrical through-hole which penetrates copper foil patterns of front and back surfaces of a print board, a proper plating process can be performed in the case of plating the cross sectional surface of the hole after the through hole was formed.

Further, another object of the invention is to reduce the working time when a microhole is formed by using a laser beam.

That is, the board portion of the above print board is made of a resin material such as polyamide or the like and the circuit pattern portions of the front and back surfaces are made of copper foils. When a laser beam of the same power is irradiated to a working portion of the print board, it takes a long time to form a hole in the copper foil portion of the front surface and such a power is too large to form a hole in the resin portion of the lower surface of the copper foil. Further, it takes a long time to form a hole in the copper foil portion of the back surface. Moreover, a carbide is produced when a hole is formed in the resin portion, so that the smoothness of the cross sectional surface of the hole is lost by the carbide.

The invention, therefore, intends to provide a working method whereby a laser output power is made variable in accordance with a construction of a cross sectional surface at a position of a working object to be worked.

Further, the invention provides a working method whereby constructing conditions of a print board in which holes are to be formed, for instance, a material and a thickness of a resin of a resin base plate layer and thickness dimensions of copper foil portions of front and back surfaces of the base plate layer are processed into information which can be controlled by a computer, an output value and an output time of a laser beam are determined on the basis of the information processed signal, and thereby enabling the holes to be highly accurately formed.

According to the invention, to solve the above subjects, an output power of a laser is first converted into a pulse signal and the pulse output signal is made variable in accordance with each portion of the copper foil portion and the resin portion of the front surface of the print board and the copper foil portion of the back surface. Thus, holes can be formed in accordance with a thickness and a hardness of a material of each portion.

Further, according to the invention, the intermediate oscillation to work the resin portion as an intermediate oscillation between the initial oscillation and the final oscillation of the pulse output to work the copper foil portions of the front and back surfaces is controlled so as to perform a low power oscillation or a gradually increasing oscillation according to a hardness of resin.

As one of the subjects of the invention, there is a subject to raise the accuracy of the surface roughness of a cross sectional surface of the hole. When a pulse laser beam of a desired output power is continuously irradiated to the resin portion in order to form a hole by a laser, the fusion of the resin due to the heating of the resin progresses and the hole diameter increases. On the other hand, in the case of a print material in which a glass fiber is mixed into the resin portion in order to reinforce the print board, the surface roughness accuracy of the cross sectional surface deteriorates due to the carbonation of the glass fibers. To prevent such a problem, the invention provides effective means.

Further, the invention provides a method of working a print board by a laser beam whereby in order to form holes by laser pulses on the basis of constructing information of the print board, the print board having first and second layers made of copper foils to form electric circuits on the front and back surfaces of a base plate layer made of a resin material is worked by using a laser, wherein a working speed for each material of the base plate layer, a working time according to a thickness dimension of the base plate layer, and a working speed and a working time according to the thickness dimensions of the first and second layers are previously measured, the laser beam is converted into a pulse signal, and the oscillating output power of the pulse signal is controlled in accordance with a state of each layer of the print board.

According to the invention, the pulse output and the oscillation time are controlled on the basis of the time which is needed to work the resin portion of the print board, a desired cooling time of the heat generation in association with the pulse irradiation, and a desired energy to work the copper foil portions.

Further, according to the invention, to accomplish the above objects, there is provided a method whereby holes are formed by irradiating a laser beam to a printed circuit board in which a conductive foil is adhered to the surface of a resin portion, wherein two kinds of laser beams having different wavelengths are used and working conditions are changed upon working of the resin portion and upon working of the foil portion.

According to the method of the invention, the laser light source can be pulse oscillated. In this case, upon working of the resin portion, the pulse height and/or pulse width of the laser beam of the long wavelength can be gradually changed.

BRIEF DESCRIPTION OF THE DRAWINGS

FIGS. 1 to 3 show the first embodiment;

FIGS. 4A, 4B, 5, and 6 show the second embodiment;

DETAILED DESCRIPTION OF THE PREFERRED EMBODIMENTS

Figure 1:
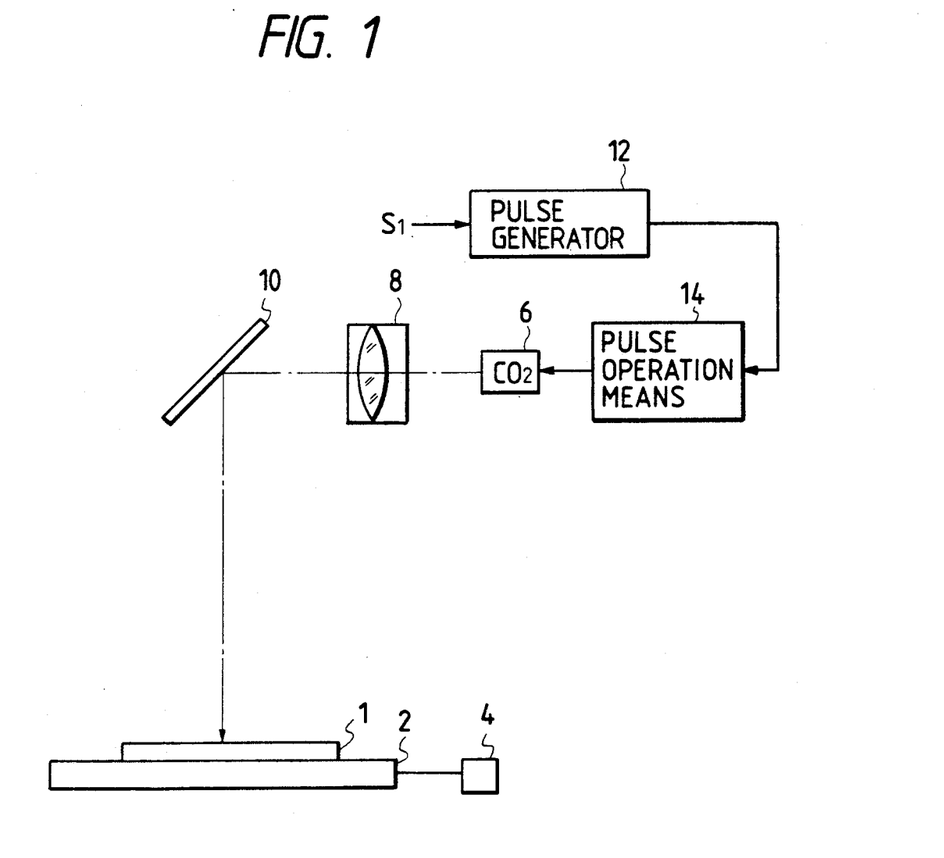
FIG. 1 is an explanatory diagram of a construction of an apparatus for embodying a laser working method of the invention.
Figure 2:
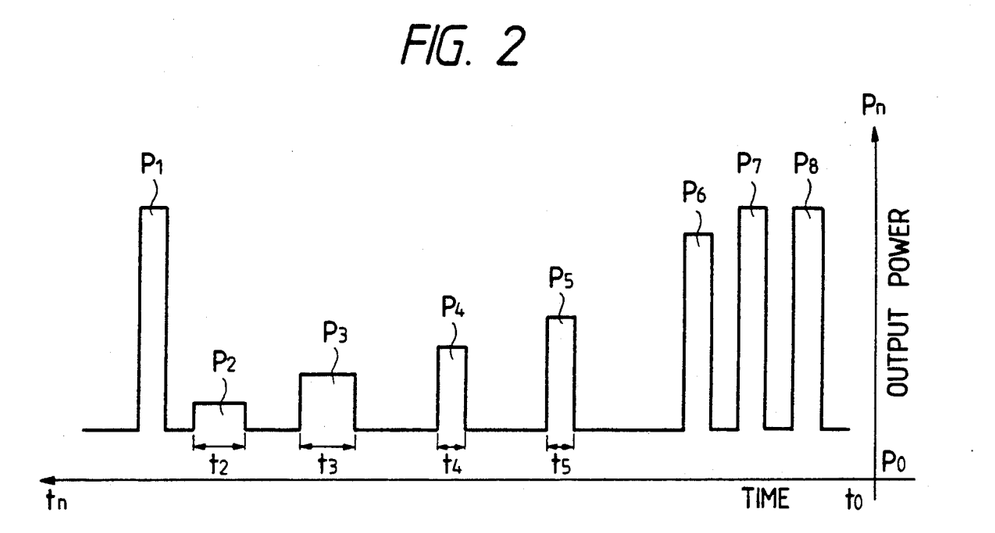
FIG. 2 is a waveform diagram of an excitation pulse to excite laser beam output means.
Figure 3:
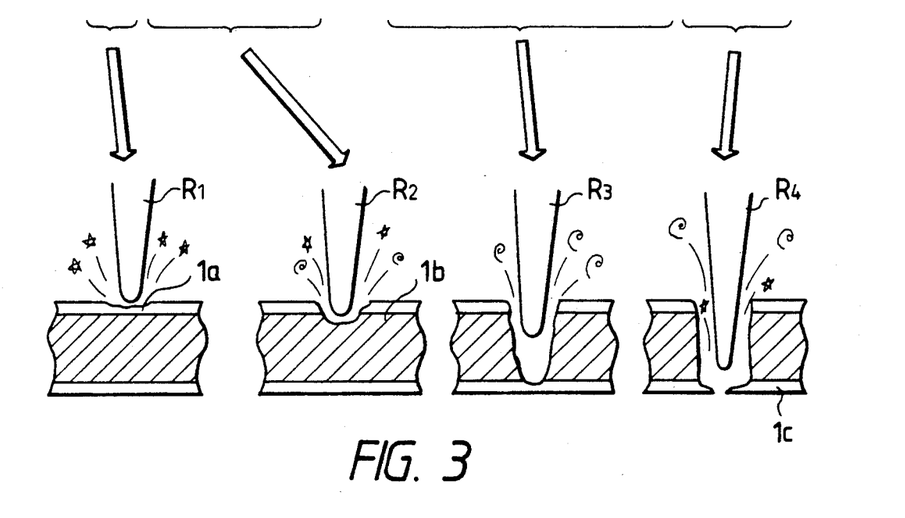
FIG. 3 is an explanatory diagram of a working state by a laser.

FIGS. 1 and 2 show the first embodiment of the present invention. FIG. 1 is a diagram showing a construction of an apparatus to execute a method of the invention. FIG. 2 is a pulse waveform diagram of a laser output in the embodiment. FIG. 3 is a diagram showing a working state. In the diagrams, reference numeral 1 denotes a print board to be worked; 2 an X - Y table stage which holds the print board 1 and can move the print board 1 in the directions of X and Y axes for a predetermined flat plane; and 4 indicates moving means such as a motor or the like for moving the X - Y table stage.

Reference numeral 6 denotes first laser output means for outputting a first laser beam such as a carbon dioxide ($CO_2$) laser or the like in a long wavelength range; 8 an optical system to control the light flux of the first laser beam; 10 a reflecting mirror to change an optical path of the laser beam which passed through the optical system 8 to the working surface of the print board 1; and 12 pulse generating means for generating an excitation pulse to drive and excite the first laser output means 6.

Pulses of a predetermined duty ratio are output from the pulse generating means 12. Reference numeral 14 denotes means for processing the output pulses from the first pulse generating means 12. The processing means 14 receives the pulse signal from the pulse generating means 12 and processes it into a signal as shown in FIG. 2.

A working state will now be described with reference to FIGS. 2 and 3.

When drive pulses of a predetermined period are output from the pulse generating means 12 by an activation signal $S_1$, the processing means 14 outputs an excitation pulse to excite the laser output means shown in FIG. 2 by the reception of the drive pulse. For the excitation pulses, a time base is set in the direction from the right side to the left side of an axis of abscissa and an output axis of the excitation pulse is shown in an axis of ordinate.

In the excitation pulse in FIG. 2, when the drive pulse is first input to the processing means, an excitation pulse $P_1$ of a large output is output. The large excitation pulse $P_1$ is a pulse to form a hole in the copper foil portion of the surface of the print board. The number of excitation pulses $P_1$ is properly set to either one or a plural number. After the large output, as shown in FIG. 2, a plurality of pulses $P_2$ to $P_6$ of low outputs are generated. The low output waveform pulses of $P_2$ to $P_6$ are excitation pulses to work the portion of the resin material on the lower side of the copper foil portion after penetrating the copper foil portion of the surface of the print board.

As shown in FIG. 2, the excitation pulses $P_2$ to $P_6$ to work the resin portion are set so as to gradually increase the pulse output and to gradually decrease the pulse widths.

After completion of the output of the pulses of the number which penetrate the resin portion by the low output excitation pulses $P_2$ to $P_6$ to work the resin portion, excitation pulses $P_7$, $P_8$, ... of large outputs similar to that of the initial oscillation pulse $P_1$ are generated. The output pulses $P_7$, $P_8$, ... are excitation pulses to work the copper foil portion of the back surface. When the first laser output means 6 is excited by generating the excitation pulses $P_1$ to $P_8$, ... shown in FIG. 2 from the pulse processing means 14, a laser beam of the period and power corresponding to the pulse waveform shown in FIG. 2 is generated from the laser output means 6. The laser beam is irradiated to the print board 1 on the table by the reflecting mirror.

As shown in FIG. 3, the laser beam irradiated onto the print board is used such that a hole is first formed in a copper foil portion 1a of the surface of the print board by a large output laser beam $R_1$ by the initial oscillation and after penetrating the copper foil portion 1a, a hole is formed in a resin portion 1b by low power laser beams $R_2$ and $R_3$ by the intermediate oscillation. Further, after penetrating the resin portion, a hole is formed in a copper foil portion $1c$ of the back surface by a high power laser beam $R_4$ by the large output excitation pulses $P_7$ and $P_8$.

In the embodiment, the high power laser beams $R_1$ and $R_4$ by the initial oscillation and final oscillation need high powers to form holes into the copper foil portions of the front and back surfaces. The low power laser beams $R_2$ and $R_3$ by the intermediate oscillation are used to form a hole into the resin portion. The excitation pulses $P_2$ to $P_6$ of the low power laser beams $R_2$ and $R_3$ by the intermediate oscillation are set in a manner such that their powers are set to be low at the initial stage, oscillation times $t_2$ and $t_3$ are long, the output powers are sequentially gradually increased, and oscillation times $t_4$ and $t_5$ are short. For instance, at a time point when the hole in the resin portion is shallow, a duty ratio is set to a large value, thereby increasing the irradiation time of the laser beam. When the hole formed in the resin portion becomes deep to a certain extent, there occurs a fear such that the inner diameter of the hole increases due to the heat accumulation of the peripheral wall portion of the resin formed with the hole. To prevent such a problem, after the formation of the hole in the resin portion progressed to a certain degree, the beam irradiation times $t_4$ and $t_5$ are reduced in place of increasing the beam power.

As mentioned above, according to the invention, the laser beam is converted into the pulse signal, the initial oscillation of the pulse is set to a high output, and the intermediate oscillation after that is set to a low output. Thus, the hole forming work of the copper foil portion of the print board and the hole forming work in the resin portion on the lower side of the copper foil portion can be highly accurately executed.

On the other hand, by gradually increasing the beam power to form a hole in the resin portion and by reducing the beam irradiation time, the heat accumulation of the peripheral wall of the hole formed in the resin portion can be prevented and the surface roughness of the cross sectional surface can be highly accurately obtained.

Figure 4A:
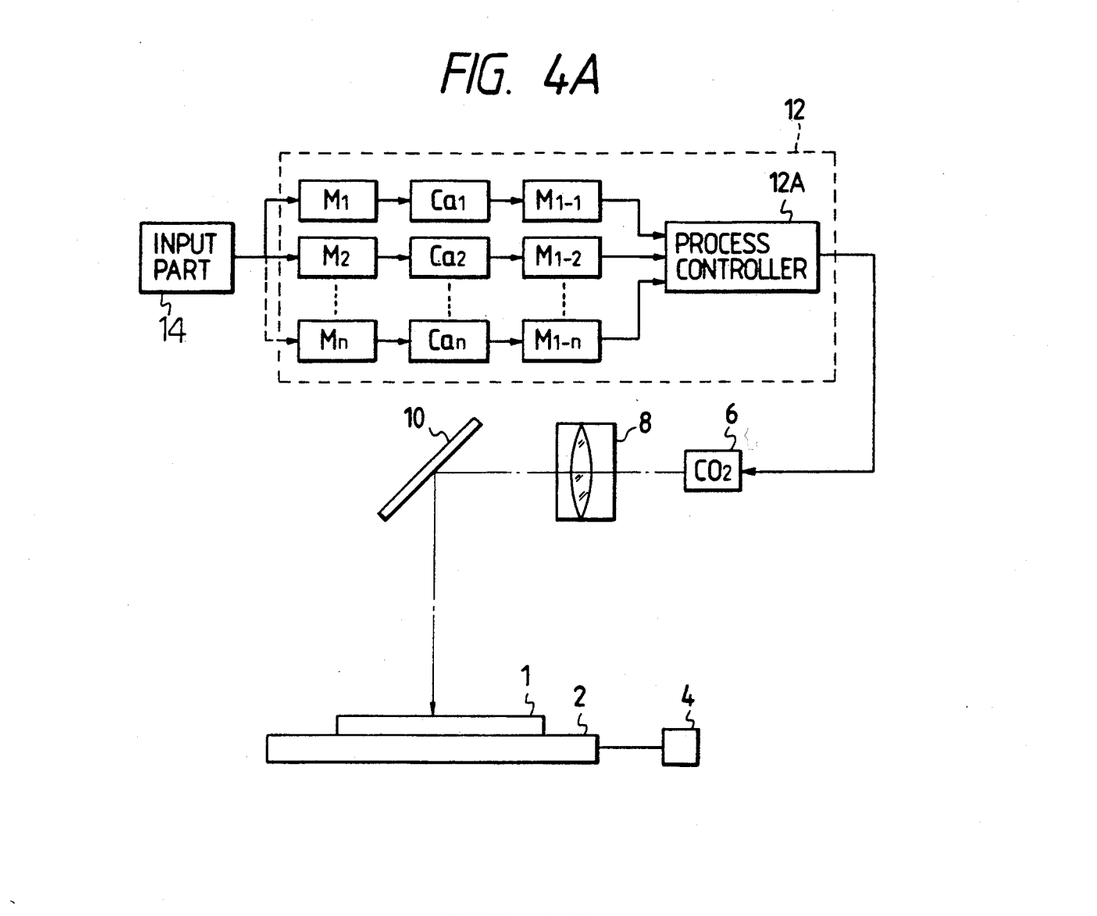
FIG. 4A is a constructional diagram for explaining the second embodiment of the invention.
Figure 4B:
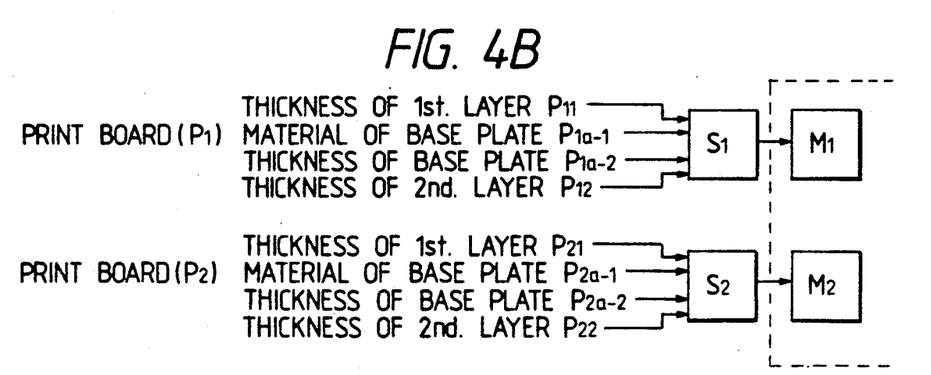
FIG. 4B is an explanatory diagram of an input section in FIG. 4A.
Figure 5:
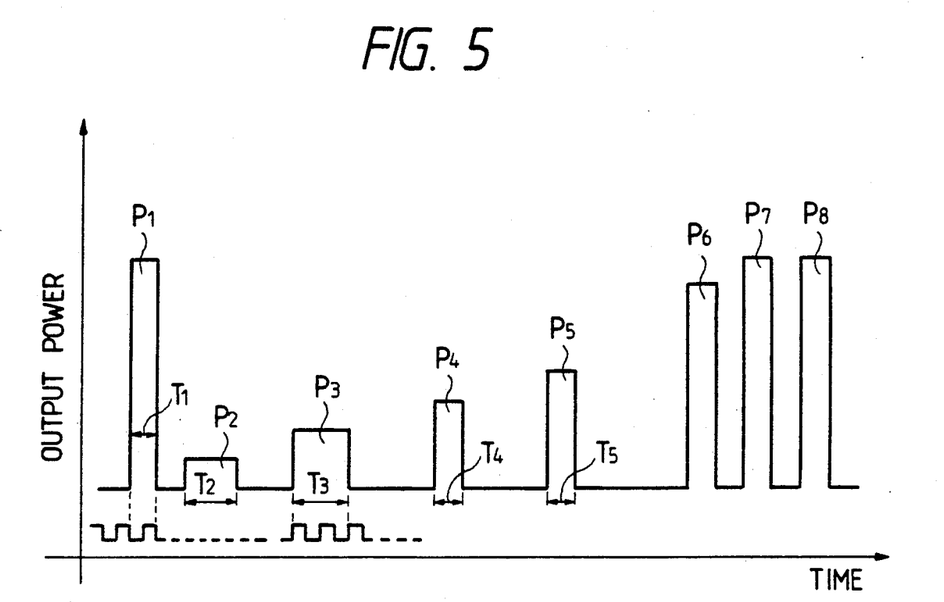
FIG. 5 is a waveform diagram of an excitation pulse to excite laser beam output means.
Figure 6:
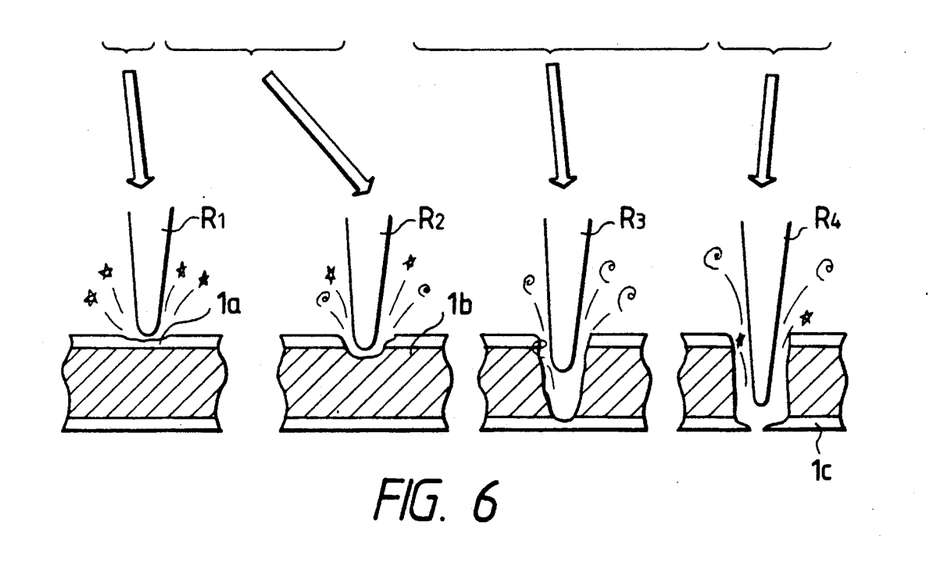
FIG. 6 is an explanatory diagram of a working state by a laser.

FIGS. 4A, 4B, and 5 show the second embodiment of the invention. FIG. 4 is a diagram showing a construction of an apparatus for executing the method of the invention. FIG. 5 is a pulse waveform diagram of a laser output in the embodiment. FIG. 6 is a diagram showing a working state. In the diagram, reference numeral 1 denotes the print board to be worked; 2 indicates the X - Y table stage which holds the print board 1 and can move the print board 1 in the directions of the X and Y axes for a predetermined flat plane; and indicates moving means such as a motor or the like for moving the X - Y table stage.

Reference numeral 6 denotes the first laser output means for outputting the first laser beam such as a carbon dioxide ($CO_2$) gas laser or the like in a long wavelength range; 8 the optical system to control the light flux of the first laser beam; 10 the reflecting mirror for changing the optical path of the laser beam which passed the optical system 8 to the working surface of the print board 1; and 12 the control means for outputting exciting pulses to drive and excite the first laser output means 6.

The control means comprises: memory means $M_1$, $M_2$, ..., $M_n$ for storing the information of the print board shown in FIG. 4B, which will be explained hereinlater; calculating means $Ca_1$, $Ca_2$, ..., $Ca_n$ for calculating the necessary information on the basis of the information from the memory means; memory means $M_{1-1}$, $M_{1-2}$, ..., $M_{1-n}$ for storing the results of the calculations of the calculating means; and a process controller 12A in which a working procedure is held as a program. An input section 14 denotes means for encoding the information of the print board shown in FIG. 4B and inputting to the memory means $M_1$, $M_2$, ..., $M_{14}$. The embodiment shows an example in the case where a hole forming work of one or a plurality of kinds of print boards is executed. In FIG. 4B, the material of the base plate portion made of a resin material of the first kind of print board (this kind is indicated by $P_1$) $P_1$ is encoded and the encoded data is input as, for instance, a bit signal through signal converting means $S_1$ and such information $P_{1a-1}$ is stored into the memory $M_1$. A thickness dimension of the resin of the base plate portion is also likewise encoded into a bit signal and stored into the memory $M_1$ as a signal $P_{1a-2}$.

The information of the thickness dimensions of the front and back surfaces of the print board $P_1$ is also similarly encoded into bit signals and input to the memory means $M_1$ as $P_{11}$ and $P_{12}$, respectively.

The material and thickness of the base plate layer of the print board $P_1$ are the information which is predetermined upon designing of the print board. The working speed of the laser beam working differs depending on each material or the components of the compositions. Therefore, the information according to the material and compositions are necessary.

It is assumed that the materials of the copper foil portions of the front and back surfaces of the base plate layer is set to the same material such as copper. The working speed of the laser which is used for copper is determined by the thickness dimensions of the copper foil portions. Therefore, the information $P_{11}$ and $P_{12}$ of the thickness dimensions of the first and second layers are required. In the calculating means $Ca_1$, the input information $P_{11}$, $P_{1a-1}$, ... of the print board $P_1$ and the kind of laser which is used are determined, an energy which is required to form a hole into the first layer of the print board $P_1$ is calculated, the pulse output value and the output time (time which is required to work) are calculated, and that information is input to the memory means $M_{1-1}$.

In the calculating means $Ca_1$, the pulse output value and the output time (time which is required to work) of the laser which is used are further calculated on the basis of the information $P_{1a-1}$ of the resin material of the base plate layer and the information $P_{1a-2}$ of the thickness dimension of the resin portion. The calculated information is input to the memory means $M_{1-1}$.

Further, in the calculating means $Ca_1$, the pulse output value and the output time of the second copper foil portion of the back surface of the print board are also calculated in a manner similar to the case of the first layer. The results of the calculations are input to the memory means $M_{1-1}$.

When a plurality of kinds of print boards are worked, for instance, in the case (print board $P_1$) where the base plate layer is made of a polyamide system resin material and in the case (print board $P_2$) where the base plate layer is made of a composite resin material in which a mixture material such as glass fibers or the like to reinforce the base plate is mixed into the polyamide system resin material, the information of the print boards $P_1$, $P_2$, ... are input to the memory means $M_1$, $M_2$, ..., $M_n$ through the input section and the necessary information is calculated by the calculating means $Ca_1, Ca_2, \ldots, Ca_n$ and input to the memory means.

The working state of the invention will now be described with reference to FIGS. 4A to 6.

Due to the selection of the print board to be worked, the process controller reads the information stored in the memory means $M_{1-1}$. The working is started on the basis of the information in the memory means $M_{1-1}$ with respect to the print board ($P_1$) to be worked. The process controller has therein a counter $C_1$ (not shown) to count the time synchronously with the generation of an activation signal to start the working. Reference pulses $t_0, t_1, t_2, \ldots, t_n$ are output and counted from the time point of the generation of the activation signal.

The output value and desired working time which are required to work the first layer are first read out of the memory means $M_{1-1}$ and input to the process controller. The process controller makes the laser output means 6 operative, thereby allowing the output $P_1$ which was calculated by the calculating means $Ca_1$ to be irradiated onto the working surface for only a time $T_1$. As a pulse $P_1$ to work the first layer, an excitation pulse $P_1$ of a large power is output. The large excitation pulse $P_1$ is the pulse to form a hole in the copper foil portion of the surface of the print board. The number of excitation pulses $P_1$ may be properly set to either one or a plural number. After the large output was generated, as shown in FIG. 5, a plurality of pulses $P_2$ to $P_6$ of low outputs are generated. The low output waveform pulses $P_2$ to $P_6$ are the excitation pulses to work the portion of the resin material on the lower side of the copper foil portion after penetrating the copper foil portion of the front surface of the print board.

After a predetermined number of counter pulses were counted after the output $P_1$ to work the first layer had been generated, laser pulses $P_2, P_3, \ldots, P_5$ to work the resin portion are controlled while changing the output values $P_2, P_3, P_4,$ and $P_5$ in a stepwise manner by every excitation times $T_2, T_3, \ldots, T_5$ of the laser output means 6, respectively.

If the laser irradiation by the laser output means is executed without continuously providing the intervals such as output values $P_2, P_3, \ldots, P_5$, a diameter of the hole in the resin portion is set to a value larger than the set diameter or a diameter of the hole from the front surface portion to the back surface portion doesn't become uniform because of the heat generation. Therefore, when the laser beam is irradiated, the cooling times corresponding to the output values $P_2, P_3, \ldots$ are set.

According to the experiments, when a laser beam of 10 mJ (millijule) per pulse was irradiated at an oscillation period of 100 Hz, the following elimination amounts were respectively obtained.

8.233 $10^{-6}$ mm$^3$ with respect to the first and second copper foil layers;

3.0 × $10^1$ mm$^3$ with respect to polymer; and 1.1 × $10^2$ mm$^3$ with respect to a glass material.

In the case where the insulative base plate layer was made of an epoxy plate mixed with glass fibers and a thickness of the base plate layer was set to 0.8 mm, when a laser beam of 10 mJ/pulse is irradiated by ten pulses, a through-hole was obtained. In the example of FIG. 5, the experiments were executed by setting the laser energy which is required to obtain a through hole to 10 mJ/pulse × 10 pulses comprising $P_2, P_3, P_4, \ldots P_{11}$ and by setting the cooling times $T_2', T_3', T_4', \ldots$, between the pulses to about 100 mseconds.

As shown in FIG. 5, the excitation pulses $P_2$ to $P_6$ to work the resin portion are set such as to gradually increase the pulse output and to gradually decrease the pulse width.

After completion of the output of the pulses of the number which penetrate the resin portion by the low output excitation pulses $P_2$ to $P_6$ to work the resin portion, the excitation pulses $P_7, P_8, \ldots$ of large outputs similar to the output of the initial oscillation pulses $P_1$ are output. These output pulses are the excitation pulses to work the copper foil portion of the back surface. When the first laser output means 6 is excited, the laser beam of the period and output corresponding to the pulse waveform shown in FIG. 5 is generated from the laser output means 6. The laser beam is irradiated to the print board 1 on the table by the reflecting mirror.

As shown in FIG. 6, the laser beam irradiated onto the print board is used in the following manner. A hole is first formed in the copper foil portion $1a$ of the front surface of the print board by the large output laser beam $R_1$ by the initial oscillation. After penetrating the copper foil portion $1a$, a hole is formed in the resin portion $1b$ by the low output laser beams $R_2$ and $R_3$ by the intermediate oscillation. Further, after penetrating the resin portion, a hole is formed in the copper foil portion $1c$ of the back surface by the high output laser beam $R_4$ due to the large output excitation pulses $P_7$ and $P_8$.

In the embodiment, the high output laser beams $R_1$ and $R_4$ by the initial oscillation and the final oscillation need high powers to form holes in the copper foil portions of the front and back surfaces. The low output laser beams $R_2$ and $R_3$ by the intermediate oscillation are used to form a hole in the resin portion. The excitation pulses $P_2$ to $P_6$ of the low output laser beams $R_2$ and $R_3$ by the intermediate oscillation are set in a manner such that they are set to low powers at the initial stage, the oscillation times $T_2$ and $T_3$ are long, the outputs are sequentially gradually increased, and the oscillation times $T_4$ and $T_5$ are short. For instance, at the time point when the hole formed in the resin portion is shallow, the duty ratio is set to a large value and the irradiation time of the laser beam is set to a long time. When a depth of the hole formed in the resin portion progresses to a certain extent, there occurs a fear such that an inner diameter of the hole increases due to the heat accumulation of the peripheral wall portion of the resin formed with the hole. To prevent such a problem, after the formation of the hole which is formed in the resin portion progressed to a certain extent, the beam irradiation times $T_4$ and $T_5$ are reduced in place of increasing the laser beam output.

In the case of working another kind of print board $P_n$, the process controller 12A reads out the above-mentioned information necessary to work stored in the memory means $M_{1-n}$ and controls the laser output means 6 and determines the laser output value and the output time. The print board $P_n$ can be worked on the basis of the above information.

As mentioned above, according to the invention, there is provided a method of laser working a print board having first and second layers made of copper foils to form electric circuits to front and back surfaces of a base plate layer made of a resin material, wherein a working speed of each material of the base plate layer, a working time according to a thickness dimension of the base plate layer, and a working speed and a working time according to thickness dimensions of the first and second layers are previously measured, a laser beam is converted into a pulse signal, and an output power of the oscillation of the pulse signal is controlled in accordance with a state of each layer of the print board. Thus, the print board can be highly accurately worked.

The third embodiment of the invention will now be described hereinbelow with reference to the drawings.

Figure 7:
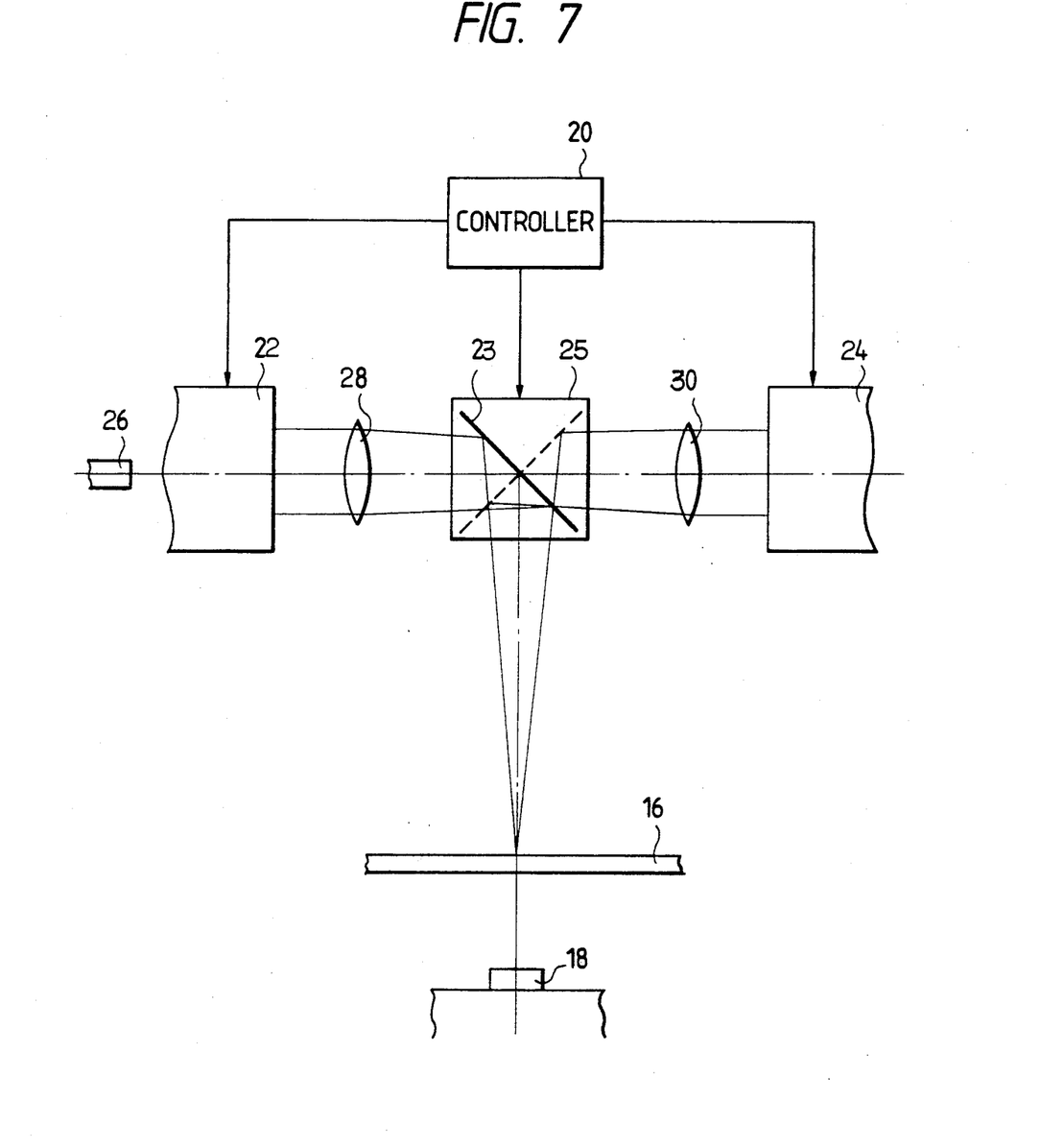
FIG. 7 is a diagram showing a schematic construction of an apparatus for embodying the method of the invention.

FIG. 7 is a diagrammatical view showing a schematic construction of an apparatus to embody the method of the invention.

In FIG. 7, reference numeral 22 denotes a first laser light source and 24 indicates a second laser light source. The first laser light source uses an excimer laser (KrF: wavelength $\lambda=248$ nm) of a short wavelength and executes the pulse oscillation. The second layer light source uses a carbon dioxide ($CO_2$) laser (wavelength $\lambda=10.6$ $\mu$m) of a long wavelength and executes the pulse oscillation. A YAG laser (wavelength $\lambda=1.06$ $\mu$m) can be also used in place of the $CO_2$ gas laser.

Reference numeral 26 denotes a reference light source using an He-Ne laser.

Reference numeral 28 denotes a condenser lens to converge the laser beam which is irradiated from the laser light source 22 and the lens 28 is made of quartz. Reference numeral 30 denotes a condenser lens to converge the laser beam which is irradiated from the laser light source 24 and the lens 30 is made of ZnSe. GaAs can be also used in place of ZnSe.

The optical axes of the three lasers 22, 24, and 26 and the two condenser lenses 28 and 30 coincide. On the optical axis, a mirror 22 is arranged at the intermediate position between the condenser lenses 28 and 30. The mirror 22 is rotated around an axis perpendicular to the paper surface of FIG. 7 by a reverse driving apparatus 25. The mirror can be set to the first position shown by a solid line and to the second position shown by a broken line.

Reference numeral 16 denotes a print board as an object to be worked. For instance, a laminate plate to which a glass epoxy copper film was adhered (TLC-W-551 made by Toshiba Chemical Co., Ltd.: thickness is 0.6 mm) is used as a print board 16. The print board 16 is movably held by an X - Y moving table (not shown).

Reference numeral 18 indicates a detection sensor of a reference light.

When the mirror 23 is arranged at the first position, the laser beam from the laser light source 22 is converged by the condenser lens 28 and reflected by the mirror 23, so that a light spot (for example, 100 $\mu$m $\phi$) is formed at a predetermined working position of the print board 16.

Reference numeral 20 indicates a controller to control the oscillations of the laser light sources 22 and 24 and the operation of the mirror reverse driving apparatus 25.

In the embodiment, when an irradiation command is generated from the controller 20 to the laser light source 22, a command signal is generated from the controller 20 to the reverse driving apparatus 25 so as to set the mirror 23 to the first position. On the other hand, when an irradiation command is generated from the controller 20 to the laser light source 24, a command signal is generated from the controller to the reverse driving apparatus 25 so as to set the mirror 23 to the second position. As mentioned above, according to the embodiment, the pulse oscillation of the first laser light source, the pulse oscillation of the second laser light source, and the rotation reversing operation of the mirror are synchronized.

As mentioned above, according to the embodiment, the optical path starting from the mirror 23 and reaching the print board 16 is commonly used by the two laser beams. By arranging the print board 16 perpendicularly to the optical path, a hole can be vertically formed with extreme precision.

In the embodiment, in a state in which the print board 16 is not attached, the laser beam irradiated from the reference laser light source 26 is detected by the sensor 18, thereby enabling the positions of the laser and optical system to be adjusted.

Figure 8:
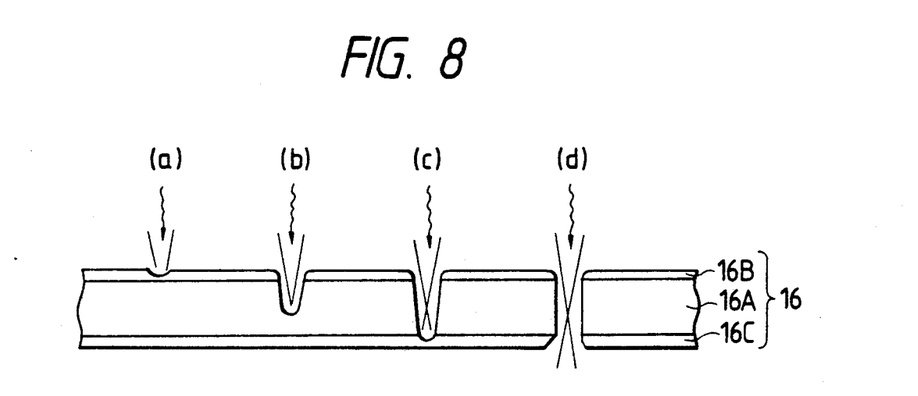
FIG. 8 is a cross sectional view showing a print board when a hole forming work of the invention is executed.

FIG. 8 shows a cross sectional view of the print board 16 when a hole forming work in the embodiment is executed. With the progress of the working, the working state changes from (a) to (d). The print board 16 is formed by adhering copper foils 16B and 6C onto both sides of a glass epoxy insulative layer (hereinafter, simply referred to as a "resin portion") 16A.

Figure 9:
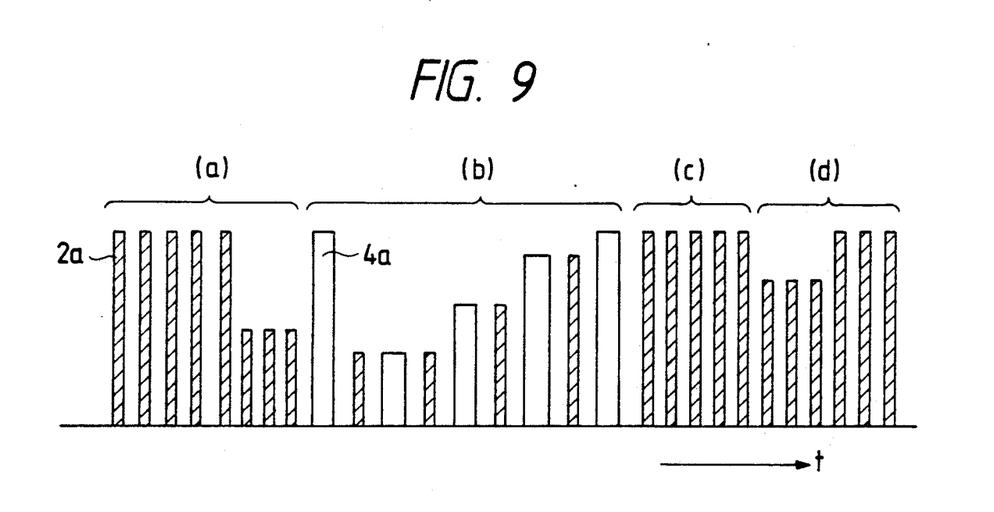
FIG. 9 is a diagram showing an example of pulse timings of a laser according to the method of the invention.

FIG. 9 is a diagram showing an example of pulse timings of the laser light sources 22 and 24 in the embodiment.

When the copper foil portion 16B in FIG. 8(a) is worked, only an excimer laser beam 2a is used as shown in FIG. 9(a). Since the excimer laser beam has a short wavelength, a photon energy is large and the absorption by the copper foil is good, so that 5 the excimer laser beam is suitable to work the copper foil portion.

When the resin portion 16A in FIG. 8(b) is worked, a $CO_2$ gas laser beam 4a is used as shown in FIG. 9(b). Since the $CO_2$ gas laser beam has a long wavelength, a photon energy is small and the working is mainly thermally executed. Thus, the $CO_2$ gas laser beam is suitable to work the resin portion 16A. However, in the case of the working by such a laser beam of a long wavelength, a black carbide is produced. On the other hand, since etching rates of glass and epoxy are different, a roughness degree of the inside wall surface of the hole becomes large. Therefore, upon working of the resin portion, the excimer laser beam 2a is also used as shown in FIG. 9(b). Due to this, the carbide is eliminated and the difference between the etching rates decreases and a good hole with less roughness of the inside wall surface is formed.

In the above processing step, since there is a fear such that a transmittance of the laser beam deteriorates as the depth of the hole formed increases, the pulse height is gradually increased.

Then, when the copper foil portion 16C in FIG. 8(c) is worked, only the excimer laser beam 2a is used as shown in FIG. 9(c).

Finally, after a through-hole shown in FIG. 8(d) was formed, the excimer laser beam 2a is irradiated as a finishing step of eliminating the residual matter on the inside wall surface of the hole as shown in FIG. 9(d).

As shown in FIG. 9, in the embodiment, two laser beams are not simultaneously pulse output. When each of the laser beams is pulse generated, the position of the mirror 23 is controlled so as to lead the laser beam to the working position of the print board 16.

Figure 10:
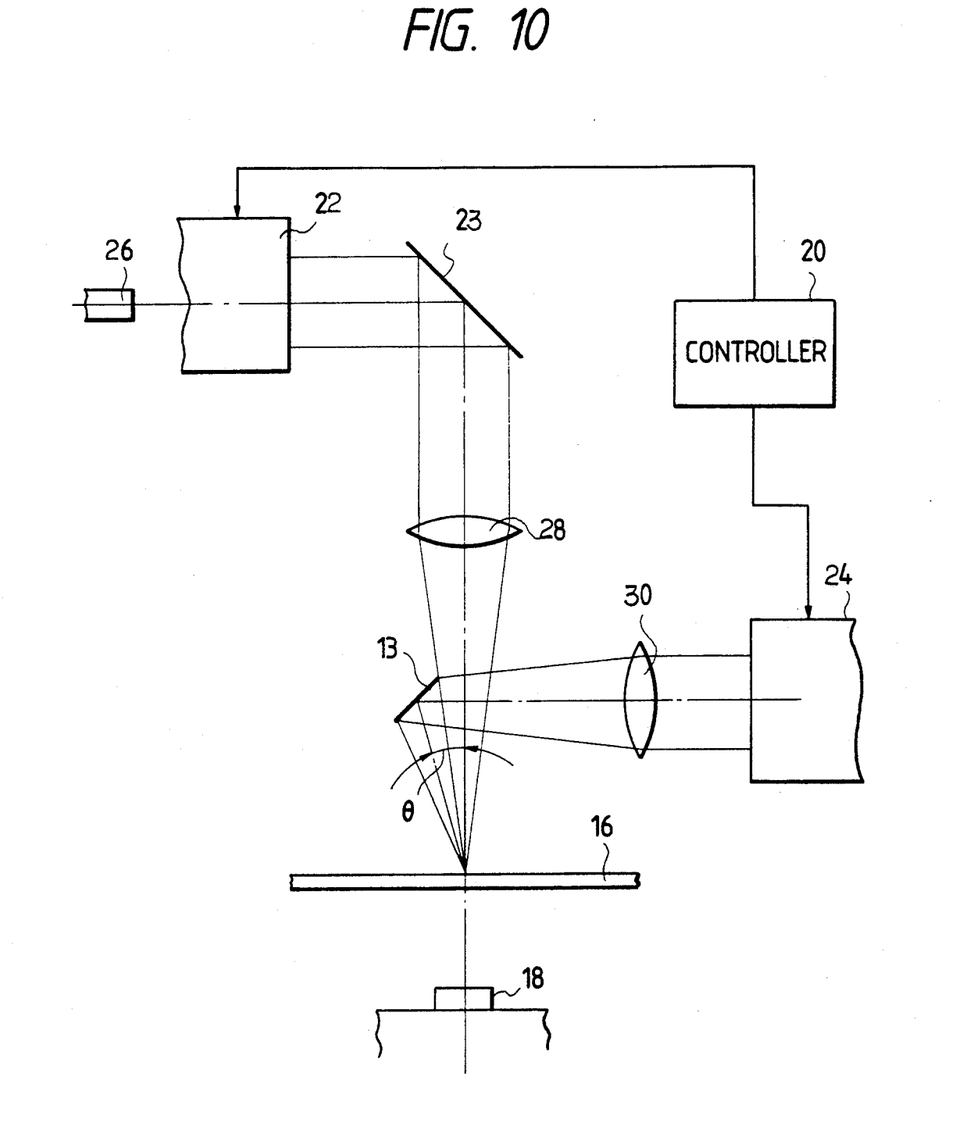
FIG. 10 is a diagram showing a schematic construction of an apparatus for embodying the method of the invention.

FIG. 10 is a diagrammatical view showing a schematic construction of an apparatus to realize another embodiment of the method of the invention. In the diagram, the parts and components similar to those in FIG. 7 are designated by the same reference numerals.

In the embodiment, the mirror 23 is fixed without reversing. The mirror is used only for the laser beam from the laser light source 22. A mirror 13 is used for the laser beam from the laser light source 24.

The mirror 13 is fixed without interrupting the optical path starting from the condenser lens 28 and reaching the print board 16. Therefore, the laser beam from the laser light source 24 is converged by the condenser lens 30 and reflected by the mirror 13, so that a light spot (for instance, 100 μmϕ) is formed at a predetermined working position of the print board 16. There is a difference of angle θ between the optical path from the mirror 23 to the print board 16 and the optical path from the condenser lens 28 to the print board 16. The angle θ is set to a value within a proper range (for example, within 15°) such as to accomplish a desired accuracy of the hole forming work.

Figure 11:
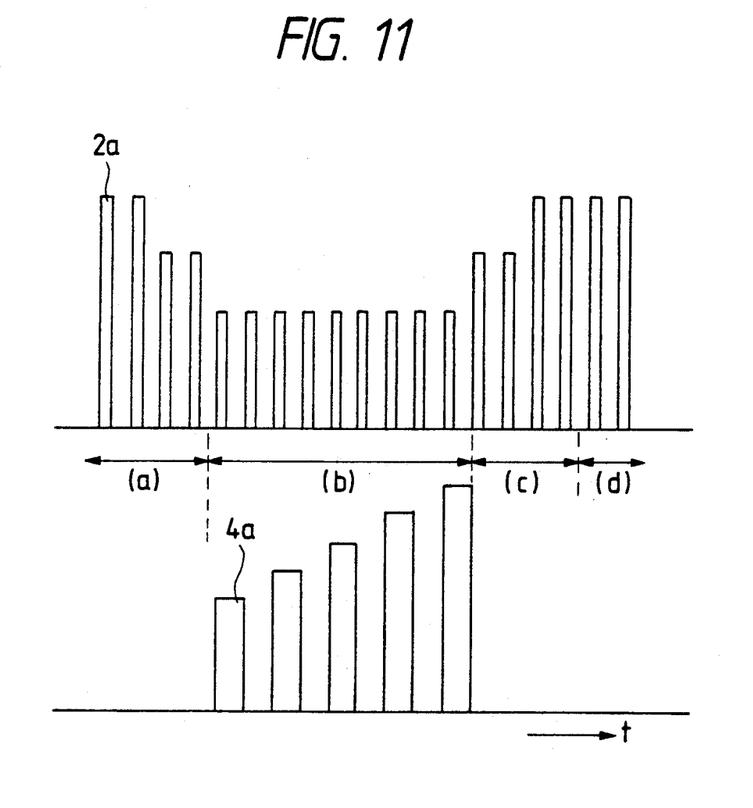
FIG. 11 is a diagram showing an example of pulse timings of a laser according to the method of the invention.

FIG. 11 is a diagram showing an example of pulse timings of the laser light sources 22 and 24 in the embodiment. In FIG. 11, (a) to (d) correspond to (a) to (d) in FIG. 8 in a manner similar to the case of FIG. 9.

In the embodiment, as shown in FIG. 11, in the working step of the resin portion in FIG. 11(b), two kinds of laser beams 2a and 4a can be simultaneously irradiated to the print board 16. Therefore, according to the embodiment, the working efficiency of the resin portion is further improved.

Even in this embodiment, the effects similar to those in the first embodiment are obtained.

The present invention is not limited to the above embodiments but many proper variations and modifications are possible.

For instance, upon working of the resin portion, in addition to that the pulse height of the $CO_2$ gas laser beam is gradually increased. This is because the heat is accumulated with the progress of the working when the resin portion is worked and there is a case where the hole diameter increases due to an influence by the heat accumulation, and in order to prevent such a problem, the irradiation time (pulse width) is gradually reduced.

On the other hand, in order to improve the working speed and/or working accuracy in accordance with the material of the resin portion of the print board and the material of the foil portion, the height and width of each pulse of the laser beams in each processing step, the number of pulses, and further a combination method of the two kinds of laser beams can be properly set.

As described above, according to the method of the invention, two kinds of laser beams of different wavelengths are used, the working conditions are properly changed in accordance with the working of the resin portion and the working of the foil portions, the high speed working using a high power of the laser of a long wavelength and the clear working using a high photon energy of the laser of a short wavelength are combined as necessary, the optimum working conditions can be set in accordance with the working characteristics of the resin portion and foil portion, and a hole forming work can be preferably executed.

On the other hand, by converting the laser beams into pulse signals, the optical paths of the portions where two kinds of laser beams enter the print board are commonly used, and the laser beams can be alternately used at an extremely high speed cycle. Due to this, the good hole forming work can be performed by using substantially both of the laser beams as necessary.

What is claimed is:

1. A method of forming a hole in a working object such as a print board or the like, comprising the steps of:
   irradiating a working surface of the working object with a laser beam, and
   converting the laser beam of a laser light source into a pulse signal having an initial oscillation and a final oscillation set to a high output oscillation, and an intermediate oscillation set to a low output oscillation or an oscillation whose output is gradually increased.

2. A method according to claim 1, further comprising the step of setting a pulse frequency of the intermediate oscillation lower than a pulse frequency of the final oscillation.

3. An apparatus for working a print board
   formed by first and second layers made of copper foils to electrically connect circuit parts and a base plate to support the first and second layer, said apparatus comprising:
   a laser light source for emitting a laser beam;
   means for pulse oscillating the laser beam; and
   means for controlling the pulse oscillating means, wherein
   said control means includes means for storing various information such as materials of the first and second layers and the base plate layer, thickness dimensions of the first and second layers and the base plate layer and working speed of the laser beam for every material, and means for calculating a pulse output which is required to work each of the layers on the basis of the information stored in said storing means.

4. A method of forming and working holes into a printed circuit board, comprising the steps of:
   adhering a conductive foil onto a surface of a resin portion of the printed circuit board;
   irradiating the printed circuit board with a laser beam from a laser source to form holes therein, and
   using a laser source which emits two kinds of laser beams having different wavelengths, with one of the laser beams being carbon dioxide laser for forming holes in the resin portion, and the other laser beam being an excimer laser for forming holes in the conductive foil.

5. A method according to claim 4, further comprising the step of pulse oscillating the laser beams.

6. A method according to claim 5, further comprising the step of synchronizing the pulse oscillations of the laser beams and simultaneously irradiated the beams to a same position.

* * * * *

UNITED STATES PATENT AND TRADEMARK OFFICE
CERTIFICATE OF CORRECTION

PATENT NO. : 5,073,687

DATED : December 17, 1991

INVENTOR(S) : Hideho Inagawa, et al.

It is certified that error appears in the above-identified patent and that said Letters Patent is hereby corrected as shown below:

On the title page:

[30] FOREIGN APPLICATION PRIORITY DATA:

Insert: --Jun. 4, 1990 [JP] Japan............... 2-146435--.

COLUMN 1:

Line 48, "an enough plating" should read --a sufficiently plated--.

COLUMN 2:

Line 29, "sub-" should read --objects--.

Line 30, "jects" should be deleted.

Line 44, "subjects" should read --objects-- and "a" should read --an--.

Line 45, "subject" should read --object--.

COLUMN 5:

Line 52, "and indicates" should read --and 4 indicates--.

COLUMN 6:

Line 8, "$M_{14}$." should read --$M_n$.--.

UNITED STATES PATENT AND TRADEMARK OFFICE
CERTIFICATE OF CORRECTION

PATENT NO. : 5,073,687

DATED : December 17, 1991

INVENTOR(S) : Hideho Inagawa, et al.

It is certified that error appears in the above-identified patent and that said Letters Patent is hereby corrected as shown below:

COLUMN 7:

Line 55, "8.233 $10^{-6}$ mm$^3$" should read --8.2 x $10^{-6}$ mm$^3$--.

COLUMN 9:

Line 14, "layer" should read --laser--.

COLUMN 10:

Line 16, "copper foils 16B and 6C" should read --copper foils 16B and 16C--.

Line 26, "5" should be deleted.

UNITED STATES PATENT AND TRADEMARK OFFICE
CERTIFICATE OF CORRECTION

PATENT NO. : 5,073,687

DATED : December 17, 1991

INVENTOR(S) : Hideho Inagawa, et al

It is certified that error appears in the above-identified patent and that said Letters Patent is hereby corrected as shown below:

Column 12 line 47, "carbon" should read --a carbon--.
          line 55, "irradiated" should read --irradiating--.

Signed and Sealed this

Eighteenth Day of May, 1993

Attest:

MICHAEL K. KIRK

Attesting Officer      Acting Commissioner of Patents and Trademarks